May 14, 1968 R. J. CHEN 3,382,764
PHOTOGRAPHIC EXPOSURE AND PROCESSING APPARATUS
Filed April 25, 1966 2 Sheets-Sheet 1

INVENTOR.
Richard J. Chen
BY
Brown and Mikulka
and
Robert E. Corb
ATTORNEYS

INVENTOR.
Richard J. Chen
BY
Brown and Mikulka
and
Robert E. Corb
ATTORNEYS

United States Patent Office 3,382,764

Patented May 14, 1968

3,382,764
PHOTOGRAPHIC EXPOSURE AND PROCESSING APPARATUS

Richard J. Chen, Winchester, Mass., assignor to Polaroid Corporation, Cambridge, Mass., a corporation of Delaware Filed Apr. 25, 1966, Ser. No. 544,746
6 Claims. (Cl. 88—24)

ABSTRACT OF THE DISCLOSURE

Photographic apparatus for exposing and processing successive sections of a photosensitive sheet including an exposure system for exposing a variable area of the photosensitive sheet and a visible indicator coupled with the exposure system for indicating the length of the area exposed.

This invention relates to photographic apparatus for exposing, and processing successive areas of a photosensitive image-recording, sheet to produce visible images in said sheet and more particularly to apparatus useful for copying graphic subject matter, particularly documents Photographic apparatus of the type comprehended by the present invention generally includes means for exposing successive areas of a light-sensitive, image-recording sheet to light from a subject, such as a document, page of a book, photograph, etc.; cutting the exposed, image-recording sheet into sections each including an exposed area; and treating each of the sections with a liquid processing agent to form a visible (positive) image of the subject. The exposure system of the apparatus comprises means for supporting successive sections of the photosensitive sheet in position for exposure, means for locating a subject in position for exposure, means for illuminating the subject, and an optical system including an object lens for producing an image of the subject on the section of the photosensitive sheet positioned for exposure. The processing system includes means for severing each exposed section of the photosensitive sheet from the remainder of the sheet and applying a liquid processing agent to the exposed area of each section to effect visible image formation.

An object of the invention is to provide, in photographic apparatus of the type described including means for exposing successive areas of a photosensitive sheet and processing means for treating sections of said sheet, each including an exposed area, with a processing liquid, novel and improved means for varying the length of each exposed area coupled with said processing means for varying the length of each processed section in accordance with the length of the exposed area thereof.

Another object of the invention is to provide, in apparatus as described including means for positioning graphic material for exposure in a first plane and means for positioning a photosensitive sheet for exposure to light from the graphic information in a second plane spaced from the first plane, means associated with the second plane for varying the lengths of the exposed areas of the photosensitive sheet coupled with means associated with the first plane for indicating the boundaries of the exposed area.

Other objects of the invention will in part be obvious and will in part appear hereinafter.

The invention accordingly comprises the apparatus possessing the construction, combination of elements and arrangement of parts which are exemplified in the following detailed disclosure, and the scope of the application of which will be indicated in the claims.

For a fuller understanding of the nature and objects of the invention, reference should be had to the following detailed description taken in connection with the accompanying drawings wherein.

Figure 1:
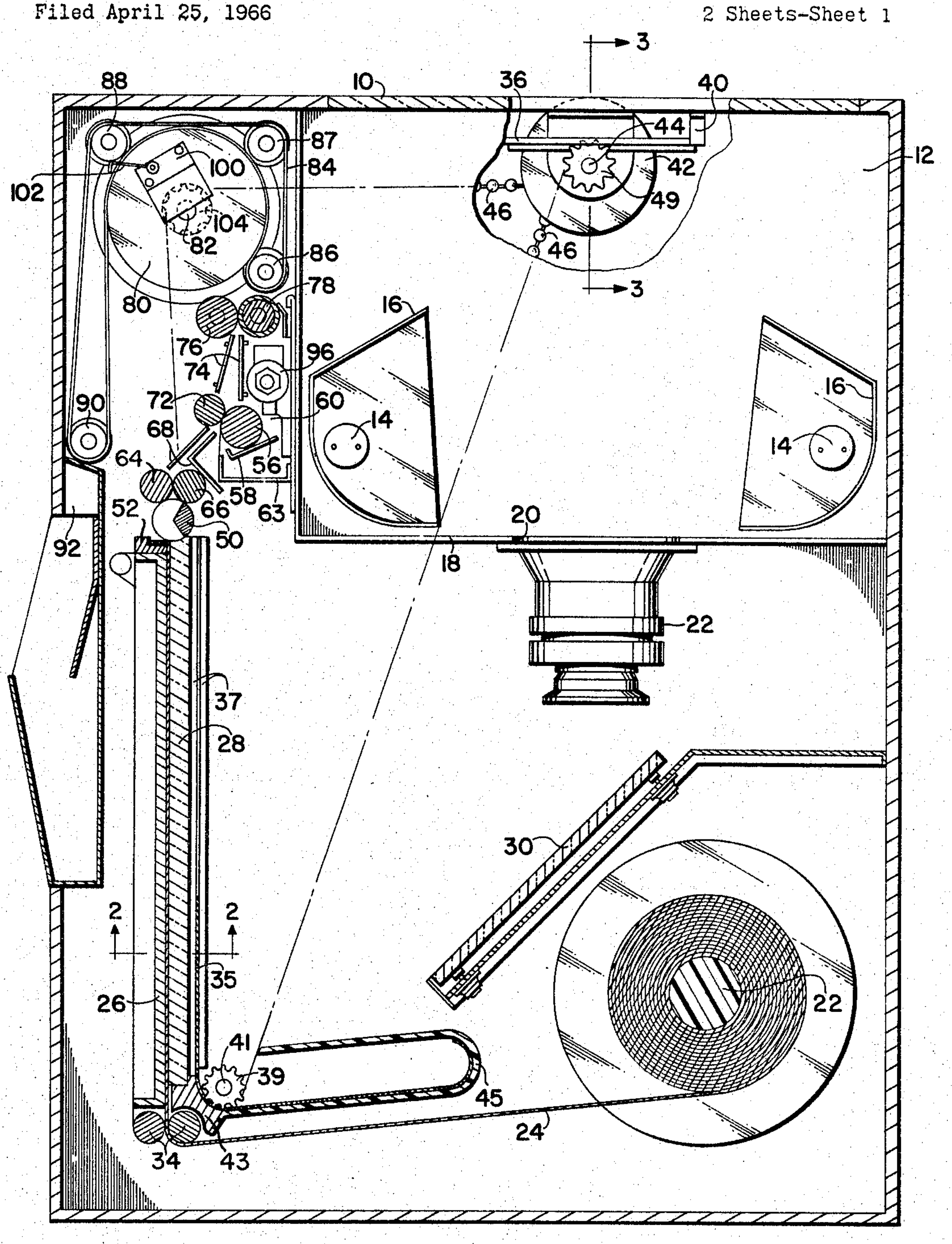
FIG. 1 is a sectional, elevational view of photographic document copying apparatus embodying the invention.
Figure 3:
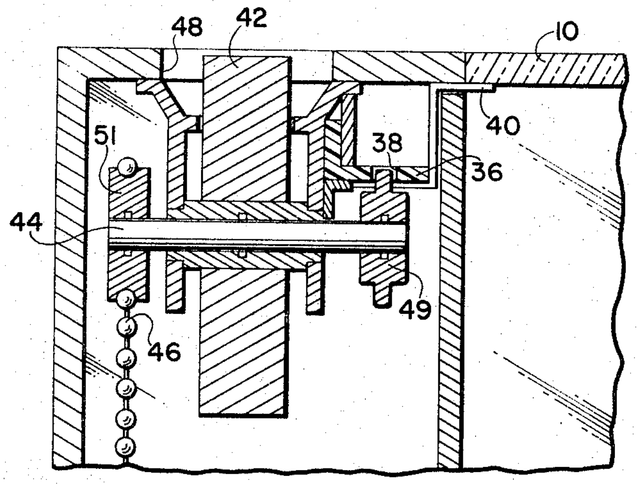
FIG. 3 is an enlarged sectional view taken substantially along the line 3—3 of FIG. 1 showing details of another portion of the apparatus.
Figure 2:
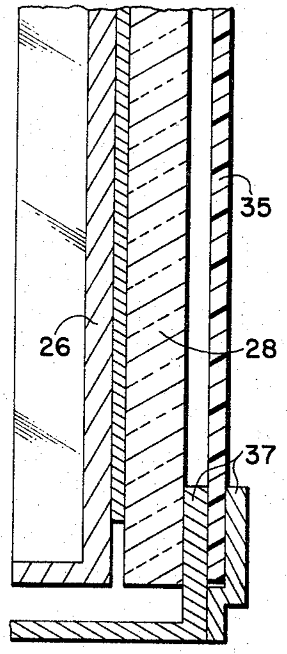
FIG. 2 is an enlarged sectional view taken substantially along the line 2—2 of FIG. 1 showing details of a portion of the apparatus.

The document copying apparatus of the invention is shown in FIGURE 1 as comprising an exposure system including a generally horizontal transparent window 10 comprising the upper wall of a chamber 12 in which lamps 14 and reflectors 16 are mounted for illuminating subject matter, especially graphic material, on the upper surface of window 10. The chamber is defined by walls comprising the housing of the apparatus including a lower wall 18 provided with a centrally located opening 20 in which is mounted an objective lens and shutter assembly 22 of a conventional type employed in photography. The apparatus is primarily intended to photograph graphic materials, particularly documents, pages of books, and the like which are rectangular in shape, and accordingly, window 10 is rectangular in shape and has length and width dimensions at least equal to those of the largest document to be reproduced, e.g., 11 x 14 inches.

Means are provided for supporting successive sections of a light-sensitive, image-recording sheet, designated 24, in position for exposure to light from an original positioned on window 10 and transmitted by lens 22. These means include a generally planar support plate 26 mounted with a surface thereof in a vertical plane facing lens 22, and a transparent plate 28 located in juxtaposition with the surface of the support plate for holding successive sections of the image-recording sheet against the support plate. A mirror 30 is mounted at a 45° angle with respect to the axis of lens 22 and the plane of support plate 26 beneath the lens for redirecting light from the lens toward the support plate and a section of the photosensitive sheet positioned thereon. Mirrow 30 also produces the geometric image reversal required for a correct copy of the original. Photosensitive sheet 24 is supplied coiled upon a spool 22 mounted beneath mirror 30 and is advanced from the spool upwardly between the support plate and the transparent plate by a pair of driven feed rolls designated 34.

In a document copier designed to produce copies hav- a one-to-one size correspondence with the original, photosensitive sheet 24 is at least equal in width to window 10 and the widest document to be copied, and transparent plate 28 is at least equal in width and length to window 10 so that during each exposure the entire area of the section of the photosensitive sheet located behind transparent plate 28 on support plate 26 is exposed to light reflected from subjects located outside of window 10. It is frequently desirable to produce copies of originals that are substantially smaller than window 10 and transparent plate 28 and this practice would normally result in exposure of the entire area of the sheet located behind plate 28 and result in substantial waste of the photosensitive sheet material. Provision is made in the document copier of the invention for varying the length of the area of the photosensitive sheet exposed in order to conform more approximately with the length of the original being copied and thereby reduce wastage of the photosensitive sheet material. In the copending application of Nicholas Gold et al., Ser. No. (Case No. 3318), filed on the same date herewith, a system for controlling the length of the exposed photosensitive sheet is disclosed comprising a curtain movable across the underside of window 10 within chamber 12 for obscuring a portion of the window and preventing exposure of the photosensitive sheet by light entering the obscured portion of the window. The curtain is coupled with the processing mechanism of the apparatus so that only the exposed length of the photosensitive sheet is processed thereby making possible the saving in sheet material.

A certain amount of stray light is present both within chamber 12 and within the part of the apparatus including lens 22, mirror 30, and plates 26 and 28, and despite various provisions for absorbing all this light, such as forming the curtain underlying window 10 of a highly absorbative material, it has been found that this stray light may be sufficient to produce an undesired exposure of the photosensitive sheet material, particularly when the sheet material is highly sensitive. In the document copier of the invention, the curtain for preventing exposure of a portion of the section of the photosensitive sheet located for exposure behind plate 28 is located in front of and closely adjacent transparent plate 28 in order to prevent exposure of the photosensitive sheet by stray light within the housing of the apparatus. This curtain, designated 35, is mounted for sliding movement closely adjacent the surface of transparent plate 28 within a pair of tracks 37 at the lateral edges of the transparent plate. Curtain 35 is formed of a resilient, flexible sheet material, preferably one of the organic plastics such as the vinyls, or polypropylene, is opaque and is provided along its lateral edges with sprocket holes. A pair of toothed sprockets 39 are mounted on a shaft 41 adjacent the lower ends of tracks 37 with the teeth engaged in the sprocket holes in curtain 35, the latter being supported against the sprockets by a guide member 43. The position of curtain 35 with respect to transparent plate 28 thus can be altered by rotating sprockets 39 and a chamber 45 is provided for holding that portion of the curtain which is not disposed in front of the transparent plate. The leading edge of the curtain is preferably straight and extends perpendicularly to the direction of movement of the photosensitive sheet between plates 26 and 28 to provide for a rectangular exposed area.

The apparatus includes means associated with window 10 for indicating to the operator the location of the leading edge of the curtain to enable the operator to move the curtain so that the leading edge thereof coincides with an edge of the image of the original positioned for exposure on window 10. The indicator means comprise an elongated strip 36 provided with sprocket holes 38 mounted for lengthwise movement in a track adjacent one side of window 10. Strip 36 includes a pointer or indicator 40 on one end extending towards the opposite side of window 10 so as to be visible within the window adjacent the edge thereof for indicating the relative position of the leading edge of the curtain. The apparatus includes means providing for manually controlling the position of curtain 35 and indicator 40. These means comprise a disc 42 mounted for rotation on a shaft 44 adjacent the upper wall of the housing of the apparatus with the upper portion of disc 42 projecting through an opening 48 in the upper wall where the disc may be engaged manually and rotated. A toothed sprocket 49 is mounted on shaft 44 with the teeth engaged in the sprocket holes in strip 36 for moving the strip lengthwise to vary the position of pointer 40. Shaft 44 is coupled with shaft 41 by means for rotating the latter in response to rotation of shaft 44 and in the form shown comprises a bead chain 46 engaged with a bead chain sprocket 51 mounted on shaft 44 and a bead chain sprocket mounted on shaft 41.

The apparatus includes a processing section in which a liquid processing composition is applied to one side of the exposed photosensitive sheet for permeation into the sheet to effect formation of a visible image. Following exposure, the exposed section of the photosensitive sheet located between plates 26 and 28 is advanced upwardly between a rotary knife 50 and anvil 52 into the processing section of the apparatus while another section of the photosensitive sheet is advanced upwardly between the two plates into position for exposure. When the exposed section of the photosensitive sheet has passed between the knife and anvil, the knife is rotated to sever the section of the sheet from the remainder of the photosensitive sheet located between the plates at approximately the trailing edge of the exposed area and movement of the photosensitive sheet by feed rolls 34 is discontinued. The severed section of the photosensitive sheet continues to be moved through the processing section of the apparatus where it is treated with a liquid to produce a visible image.

The means for applying the processing liquid may take a number of different forms, such as shown for example in the copending U.S. patent application of Richard J. Chen et al., Ser. No. 456,423, filed May 17, 1965, or it may take the form shown, for example, in the drawings herein. The processing system shown is adapted to apply a nonviscous liquid to the exposed side of the photosensitive sheet and is of the type described together with processes and the materials useful therein in the copending U.S. application Ser. No. 368,622 of Edwin H. Land, and Ser. No. 368,621 of Edwin H. Land et al., both filed May 19, 1964. These applications describe an image-receiving sheet comprising a support and at least a layer containing a light-sensitive material, such as silver halide, and an outer layer comprising a translucent material such as finely divided titanium dioxide dispersed in a suitable, permeable, colloidal carrier or matrix such as gelatin which is permeable to an aqueous processing liquid. The translucent pigment may be incorporated in the layer containing the light-sensitive material and/or may comprise a separate outer layer which may also contain silver percipitating nuclei, and is sufficiently transparent to permit exposure of the light-sensitive layer therebeneath while being sufficiently opaque to provide the requisite background for a positive silver image transferred thereto by diffusion and to mask a negative image formed thereunder. The processing liquid preferably comprises an aqueout solution of a silver halide complexing agent, is supplied to the side of the sheet opposite the support for absorption into the light-sensitive layer in sufficient quantity to produce a silver transfer image on the surface of the translucent layer.

The processing liquid may be nonviscous, i.e., have the viscosity of water, or it may include a film forming agent and range in viscosity from that of water to a viscosity of 200,000 centipoises at 20° C. The operation and construction of the liquid applicator will depend to a large extent upon the nature and viscosity of the liquid, but in any event, will be designed to apply the processing liquid to at least the exposed (rectangular) area of each section of the photosensitive sheet as the section is advanced through the processing section of the apparatus.

The means shown in this application for applying a nonviscous processing liquid to the sheet include a cylindrical applicator roll 56 mounted for rotation about a substantially horizontal axis, a plate 58 mounted intermediate its lateral edges beneath the applicator roll for pivotal movement about an axis substantially parallel with the axis of rotation of the applicator roll, and a pair of end members 60 for engaging the roll at the ends of the cylindrical portion thereof. Plate 58, in the operative position shown in FIG. 1 is disposed with its upper surface tangent with the peripheral surface of the roll and cooperates therewith and with end members 60 to form a trough into which may be introduced a predetermined quantity of the processing liquid sufficient to treat a predetermined length of the photosensitive sheet.

Excess liquid may be disposed of and the applicator roll cleaned by pivoting plate 58 to dump excess liquid into a container 63 provided beneath the plate for this purpose. The liquid deposited in the trough is applied to a sheet by rotating roll 56 (in a counterclockwise direction) to apply the liquid as a thin layer to the peripheral surface of the roll and advancing the sheet relative to and past the roll in the opposite direction in contact with the peripheral surface of the roll to transfer the liquid from the roll to the sheet. A pair of juxtaposed feed rolls 64 and 66 mounted above knife 50 are provided for advancing each section of the photosensitive sheet from between the knife and anvil upwardly toward the applicator roll, and guides 68 are provided on opposite sides of the path of movement of the sheet between the feed rolls for guiding the sheet along a path tangent with the portion of the peripheral surfaces of applicator groll 56 lying opposite plate 58. A backing roll 72 is provided mounted in juxtaposition with applicator roll 56 for guiding and supporting the sheet against the applicator roll together with means for rotating roll 72 for advancing the sheet upwardly against the applicator roll.

From the applicator roll the sheet being treated is moved upwardly between guides 74 into the nip of a pair of rolls 76 and 78 which serve to advance the sheet upwardly and, as described in the aforementioned application Ser. No. 456,423, function as a wringer to remove excess processing liquid from the surface of the sheet. Processing of the sheet requires that the sheet remain in a dark environment during a processing period of predetermined duration, and for this purpose, the apparatus includes means defining a path of predetermined length along which each sheet is advanced from between rolls 76 and 78 within the apparatus at a speed calculated to provide the necessary processing period. These means comprise a plurality of circular discs 80 mounted for rotation in spaced axial relation on a shaft 82, and a plurality of endless belts 84, each including a portion engaged around a portion of the periphery of one of discs 80, and a return portion supported on pulleys 86, 87, 88, and 90. A sheet 24 is advanced by rolls 76 and 78 upwardly into the nip between discs 80 and belts 84 at pulleys 86 and is advanced along a cylindrical path defined by the peripheries of discs 80 from pulleys 86 past pulleys 88 to the point at which belts 84 are tangent with the discs. The belts are advanced to rotate discs 80 in a counterclockwise direction and move the sheet gripped between the discs and belts along a circular path of about 230° around the peripheries of the discs and thence downwardly from engagement with the discs and through an opening 92 in the housing located beneath and adjacent pulleys 90, the sheets having a tendency to adhere to the belts until the belts are guided around pulleys 90. A plurality of narrow belts and discs are preferred to a single belt and drum in order to limit the area of contact between the sheet and the belts and thereby facilitate drying of the sheet and separation of the sheet from the belts.

The length of each area of sheet 24 processed should be approximately coextensive with the area exposed, and is controlled by cutting each section of the photosensitive sheet to the same length as the uncovered area of window 10 and metering the quantity of processing liquid dispensed into the trough defined by plate 58 for application to each section of sheet 24. Thus, a saving will be effected in both the sheet material and the processing liquid employed. The processing liquid is dispensed in controlled quantities by a solenoid actuated valve 96 located above the trough. The length of each section of sheet 24 is determined by the length of the sheet permitted to advance between knife 50 and anvil 52 prior to actuation of the knife to sever the sheet.

The quantity of processing liquid dispensed by valve 96 is a function of the length of time the valve is open and is determined by a variable timer of a conventional type provided for controlling the operation of the solenoid actuated valve. Bead chain 46 is coupled with the timer for varying the duration of the open period of valve 96 in accordance with the position of the curtain so that the quantity of liquid dispensed for application to each exposed area of the photosensitive sheet bears a direct relationship to the length of the area as defined by the curtain.

Knife 50 is preferably electrically controlled, e.g., by means such as a solenoid or relay, in turn controlled by a microswitch 100 mounted on shaft 82 between a pair of discs 80. Switch 100 includes an actuating lever 102 extending into the path of movement of sheet 24 (supported against the peripheries of the discs) in position to be engaged by the leading edge of each section of the sheet for closing the switch and actuating the knife. It will be seen that the length of each section of the photosensitive sheet is the length of the path of movement of the sheet from the knife and anvil to lever 102 and this can be varied by changing the position of the switch by rotating shaft 82 on which the switch is mounted. A bead chain sprocket 104 is affixed to shaft 82 and is engaged with bead chain 46 for controlling the position of the switch in accordance with the position of curtain 35 so that the length of each severed section of the sheet will correspond with the length of the exposed area thereof.

It will be seen that the invention provides a simple and reliable exposure and processing system requiring that the operator rotate a single disc 42 to vary the length of the area of the photosensitive sheet exposed, the length of the section severed from the remainder of the sheet, and the quantity of processing liquid dispensed for application to the sheet so that the length of the exposed area and severed section correspond and the quantity of liquid closely approximates that required to treat each particular exposed area.

Since certain changes may be made in the above apparatus without departing from the scope of the invention herein involved, it is intended that all matter contained in the above description or shown in the accompanying drawings shall be interpreted as illustrative and not in a limiting sense.

What I claim is:

1. In photographic apparatus comprising first support means for positioning graphic material for exposure, second support means for positioning successive sections of a photosensitive sheet for exposure to light from said graphic material at a location spaced from said graphic material, image-forming means located between said support means for producing an image of said graphic material on said sheet and processing means for treating successive exposed sections of said photosensitive sheet with a liquid to produce images therein, in combination:

obturator means mounted for movement closely adjacent said second support means and said section of said sheet supported thereby in position for exposure for covering and preventing exposure of an area of said section of said sheet;

indicator means associated with said first support means; and means for moving said obturator means to any position over a predetermined range of positions to vary the length of said area covered by said obturator means, the last-mentioned means being coupled with said indicator for setting the position of said indicator to correspond with the length of said area covered.

2. Photographic apparatus as defined in claim 1 including a housing and wherein said first support means comprise a window in said housing for supporting said graphic material and said indicator is mounted within said housing underlying said window in position to be observed therethrough.

3. Photographic apparatus as defined in claim 2 wherein said housing includes means for dividing said housing into separate chambers, said window opens into one of said chambers, said photosensitive sheet is positioned for exposure in the other of said chambers, and said image-forming means transmit light from said one chamber to said other chamber.

4. Photographic apparatus as defined in claim 3 including means within said one chamber for illuminating graphic material supported for exposure against said window.

5. Photographic apparatus as defined in claim 1 wherein said obturator means include a curtain movable in a plane closely adjacent said second support means and said section of said sheet, said curtain has a transverse edge movable relative to said section of said sheet between the latter and said image-forming means and said indicator is coupled with said curtain to indicate, at said first support means, the position of said edge.

6. Photographic apparatus as defined in claim 1 wherein said processing means include control means for varying the length of each of said sections treated with a processing liquid and said control means are coupled with said obturator means for causing said processing means to treat substantially only exposed sections of said sheet.

References Cited

UNITED STATES PATENTS

| | | | |
|---|---|---|---|
| 2,938,427 | 5/1960 | Alves | 88—24 |
| 3,112,887 | 12/1963 | Brou et al. | 240—46.17 XR |
| 3,282,192 | 11/1966 | Chen et al. | 95—89 |
| 3,289,532 | 12/1966 | Baumgarten et al. | 88—24 |

NORTON ANSHER, *Primary Examiner.*

G. M. HOFFMAN, *Assistant Examiner.*